United States Patent
Watanabe et al.

(10) Patent No.: US 9,796,265 B2
(45) Date of Patent: Oct. 24, 2017

(54) TAMPER-PROOF MOLDED ARTICLE AND ACCELERATOR APPARATUS HAVING THE SAME

(75) Inventors: Hidekazu Watanabe, Aichi-gun (JP); Takehiro Saito, Kariya (JP)

(73) Assignee: DENSO CORPORATION, Kariya (JP)

( * ) Notice: Subject to any disclaimer, the term of this patent is extended or adjusted under 35 U.S.C. 154(b) by 1702 days.

(21) Appl. No.: 12/908,160

(22) Filed: Oct. 20, 2010

(65) Prior Publication Data
US 2011/0088505 A1    Apr. 21, 2011

(30) Foreign Application Priority Data

Oct. 21, 2009 (JP) ................ 2009-242300

(51) Int. Cl.
*G05G 1/44*     (2008.04)
*B23B 7/04*     (2006.01)
*B60K 26/02*    (2006.01)
*F16B 4/00*     (2006.01)
*F16B 5/12*     (2006.01)
*H05K 5/00*     (2006.01)

(52) U.S. Cl.
CPC .............. *B60K 26/02* (2013.01); *F16B 4/004* (2013.01); *F16B 5/126* (2013.01); *H05K 5/0078* (2013.01); *Y10T 74/20534* (2015.01); *Y10T 428/24289* (2015.01)

(58) Field of Classification Search
CPC .......... B60K 26/02; F16B 4/004; F16B 5/126; H05K 5/0078
USPC .............. 74/512–514, 560; 222/107; 70/247; 215/252
See application file for complete search history.

(56) References Cited

U.S. PATENT DOCUMENTS

| | | | |
|---|---|---|---|
| 5,040,692 A * | 8/1991 | Julian | 215/252 |
| 5,488,846 A * | 2/1996 | Green | 70/247 |
| 6,039,196 A * | 3/2000 | Ekkert | B65D 50/04 |
| | | | 215/216 |
| 6,446,525 B1 | 9/2002 | Borchers | |

(Continued)

FOREIGN PATENT DOCUMENTS

| DE | 10 2005 024 486 | 6/2006 |
|---|---|---|
| JP | 3-189335 | 8/1991 |

(Continued)

OTHER PUBLICATIONS

EPO Machine Translation of JP 2008-237431, Murase, Oct. 2008.*

(Continued)

*Primary Examiner* — Vinh Luong
(74) *Attorney, Agent, or Firm* — Nixon & Vanderhye P.C.

(57) ABSTRACT

A support member includes a base projection. A cover includes a press-fitting portion and a cover projection. The press-fitting portion is press-fitted to a press-fitting hole of the support member. The cover projection is placed at a location, which is spaced from the base projection in a state where the press-fitting portion is press-fitted. At time of disassembling between the support member and the cover by sliding the cover in a releasing direction, the base projection and the cover projection contact with each other to form a disassembly indication mark, which indicates the disassembling between the cover and the support member, on at least one of the base projection and the cover projection.

13 Claims, 8 Drawing Sheets

(56) References Cited

U.S. PATENT DOCUMENTS

| | | | |
|---|---|---|---|
| 6,464,093 B1* | 10/2002 | Takano | B65D 41/3428 215/252 |
| 6,793,082 B1* | 9/2004 | Long, Jr. | B65D 41/3447 215/252 |
| 7,191,759 B2 | 3/2007 | Lee | |
| 7,234,370 B2 | 6/2007 | Kim | |
| 7,753,233 B2* | 7/2010 | Umenaka | 222/107 |
| 8,038,658 B2* | 10/2011 | Kohama | 604/272 |
| 8,522,642 B2* | 9/2013 | Kaijala | 74/560 |
| 2005/0029307 A1* | 2/2005 | Py | A61F 9/0008 222/386 |
| 2005/0097983 A1 | 5/2005 | Mannle et al. | |
| 2007/0156088 A1* | 7/2007 | Hauri | 604/110 |
| 2007/0181578 A1* | 8/2007 | Johnson | B65D 41/0471 220/258.3 |

FOREIGN PATENT DOCUMENTS

| | | |
|---|---|---|
| JP | 2003-239920 | 8/2003 |
| JP | 3114468 | 8/2005 |
| JP | 2008-237431 | 10/2008 |
| JP | 2009-166804 | 7/2009 |

OTHER PUBLICATIONS

JPO Machine Translation of JP 31144681, Aug. 2005.*
JPO Machine Translation of JP 2009-166804, Saito, Jul. 2009.*
Chinese Office Action dated Aug. 1, 2012, issued in corresponding Chinese Application No. 201010517273.5 with English Translation.
Japanese Office Action dated Sep. 2, 2011, issued in corresponding Japanese Application No. 2009-242300 with English Translation.

* cited by examiner

PRESS-FITTING DIRECTION   RELEASING DIRECTION

PRESS-FITTING DIRECTION    RELEASING DIRECTION

PRESS-FITTING DIRECTION    RELEASING DIRECTION

US 9,796,265 B2

TAMPER-PROOF MOLDED ARTICLE AND ACCELERATOR APPARATUS HAVING THE SAME

CROSS REFERENCE TO RELATED APPLICATION

This application is based on and incorporates herein by reference Japanese Patent Application No. 2009-242300 filed on Oct. 21, 2009.

BACKGROUND OF THE INVENTION

1. Field of the Invention

The present invention relates to a tamper-proof molded article and an accelerator apparatus having the same.

2. Description of Related Art

A snap-fit structure is known as a structure, which connects resiliently deformable components (e.g., resin components) together. For example, Japanese Unexamined Patent Publication No. 2003-239920A teaches such a snap-fit structure, in which a claw of one component is engaged with a recess of the other component to enable easy connection between the one component and the other component.

For example, in a case of an accelerator apparatus of a vehicle, which is provided to control an operational state of an engine, it is not desirable to allow a user to disassemble the accelerator apparatus upon assembling thereof. In such an apparatus, it is demanded to implement a tamper-proof function to leave a disassembly indication mark, which is a mark that indicates the fact of the disassembling of the accelerator apparatus. In a case of a previously proposed accelerator apparatus, components are connected together through, for example, forceful plastic bending or deforming of one component against the other component upon application of heat thereof to soften the same, thereby implementing the tamper-proof function. However, in such a case, the number of assembling steps is increased. Furthermore, in the case of Japanese Unexamined Patent Publication No. 2003-239920A, the assembling operation of the components is easy. However, the disassembly indication mark cannot be left on the accelerator apparatus, so that the tamper-proof function cannot be implemented.

SUMMARY OF THE INVENTION

The present invention is made in view of the above disadvantages. According to the present invention, there is provided a tamper-proof molded article including a base and a cover. The base includes a first interference portion. The cover is installed to the base and includes a press-fitting portion and a second interference portion. The press-fitting portion is press-fitted into a corresponding portion of the base in a press-fitting direction to place the press-fitting portion into a press-fitted state. The second interference portion is placed at a location, which is spaced from the first interference portion in the press-fitted state of the press-fitting portion. The first interference portion and the second interference portion are configured such that the first interference portion and the second interference portion contact with each other to form a disassembly indication mark, which indicates disassembling between the cover and the base, on at least one of the first interference portion and the second interference portion when the cover is slid over the base in a releasing direction, which is opposite from the press-fitting direction, to release the press-fitting portion from the corresponding portion of the base and thereby to disassemble between the cover and the base.

According to the present invention, there is also provided an accelerator apparatus including the tamper-proof molded article discussed above.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Various types of accelerator apparatus of the present invention, which includes a tamper-proof molded article, will be described with reference to the accompanying drawings.

First Embodiment

Figure 1:
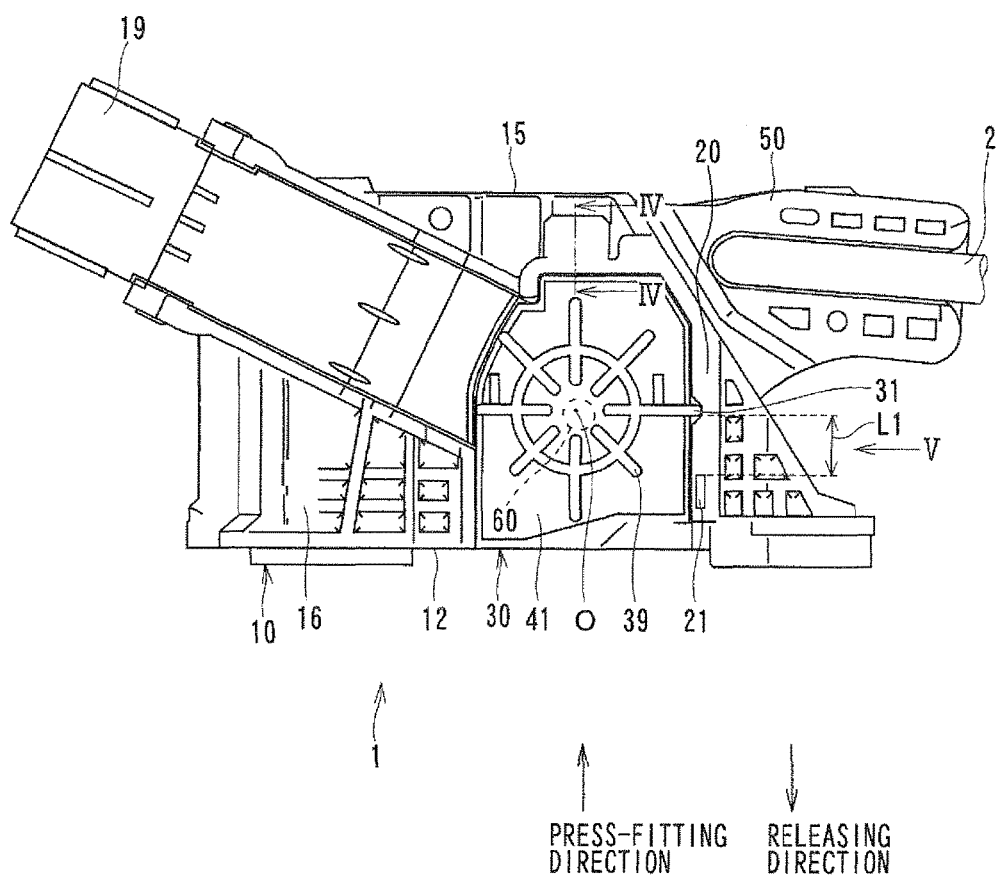
FIG. 1 is a partial lateral view of an accelerator apparatus taken from one lateral side thereof according to a first embodiment of the present invention.
Figure 2:
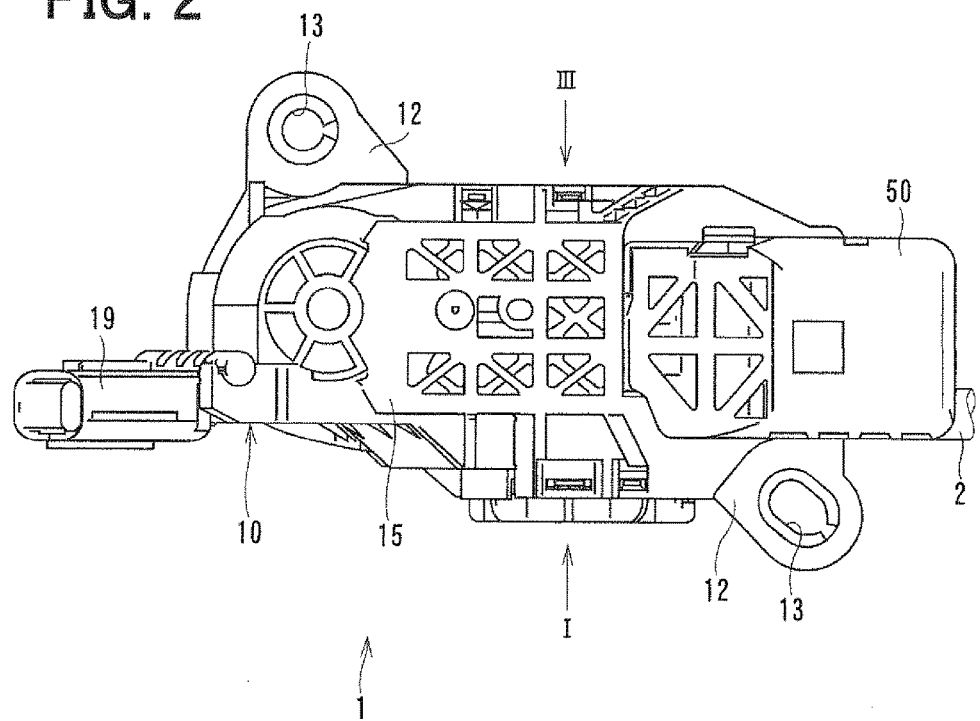
FIG. 2 is a plan view of the accelerator apparatus of the first embodiment.
Figure 3:
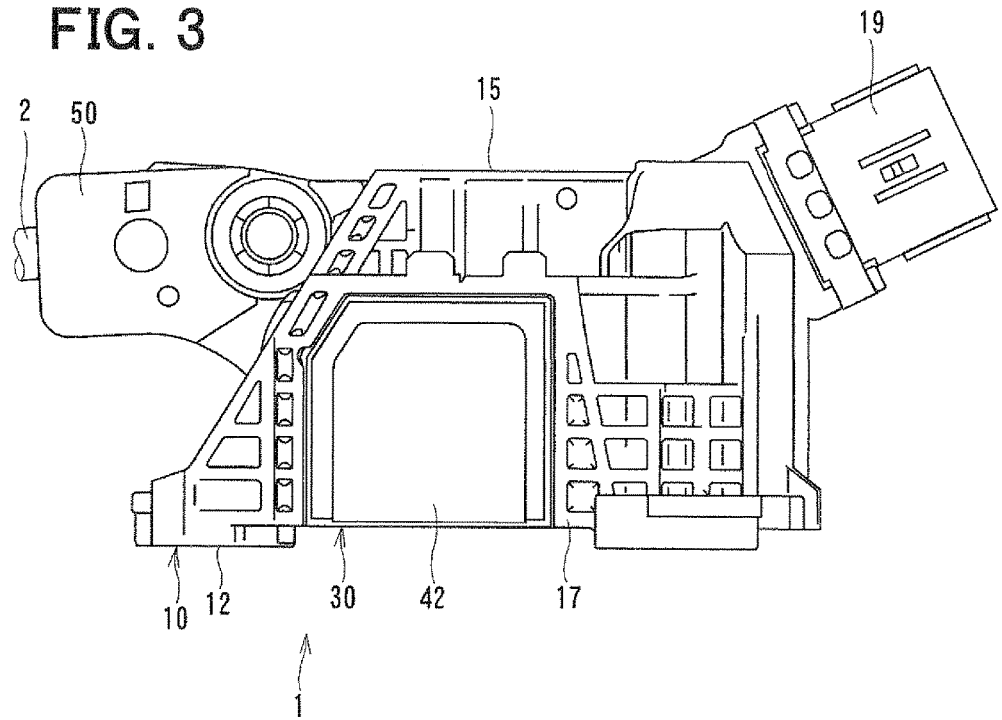
FIG. 3 is another lateral view of the accelerator apparatus of the first embodiment taken from other lateral side thereof, which is opposite from the one lateral side.
Figure 4:
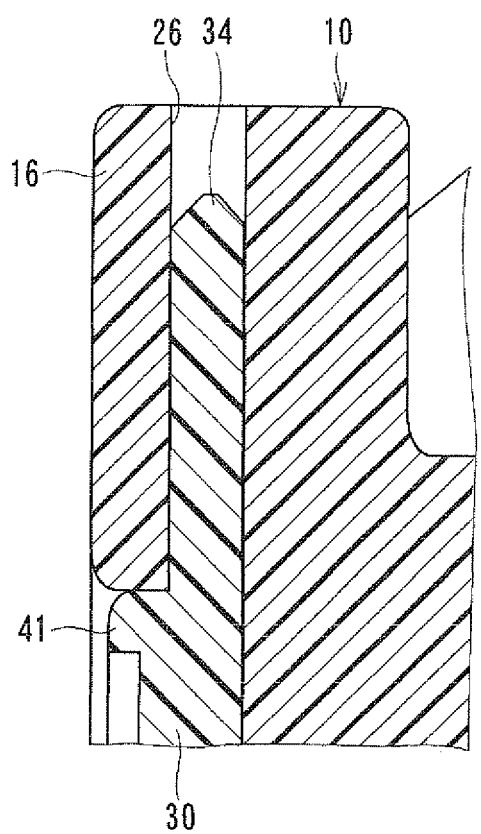
FIG. 4 is a partial enlarged cross-sectional view taken along line IV-IV in FIG. 1.

FIGS. 1 to 8 show an accelerator apparatus according to a first embodiment of the present invention. FIG. 1 is a side view taken in a direction of an arrow I in FIG. 2. FIG. 3 is a side view taken in a direction of an arrow III in FIG. 2. With reference to FIGS. 1 to 3, the accelerator apparatus 1 is installed to a vehicle and controls a driving state of the vehicle in response to an amount of depression of an accelerator pedal 2, which is operated by a driver of the vehicle. The accelerator apparatus 1 of the present embodiment is a drive-by-wire type, and thereby the accelerator pedal 2 is not mechanically connected to a throttle apparatus of the vehicle. Instead, the accelerator apparatus 1 transmits a rotational angle of the accelerator pedal 2 to an engine control unit (ECU) of the vehicle, and the ECU controls the throttle apparatus based on this rotational angle of the accelerator pedal 2.

In the accelerator apparatus 1, the accelerator pedal 2 is supported by a support member 10 through a connecting member 50 such that the accelerator pedal 2 is rotatable about a rotational axis O. The accelerator pedal 2 is urged by an urging force of a return spring (not shown) in a direction that is opposite from a depressing direction of the accelerator pedal 2, which is a direction for depressing the accelerator pedal 2 with a foot of the driver. The rotational angle (rotation) of the accelerator pedal 2, which is rotated in response to the pedal force of the driver and the urging force of the return spring, is sensed with a rotational angle sensor (serving as a rotation sensing member) 60 and is transmitted to the ECU through a connector 19.

The support member 10 is made of resin and is configured into a box shape. Specifically, the support member 10 includes a bottom plate 12, a top plate 15 and two side plates 16, 17. The top plate 15 is opposed to the bottom plate 12. The side plates 16, 17 are generally perpendicular to the bottom plate 12 and the top plate 15 and are opposed to each other. The bottom plate 12 has mount holes 13, through which bolts are inserted to fix the bottom plate 12 to a vehicle body.

The top plate 15 is formed to have a planar surface, which is generally parallel to the bottom plate 12. The top plate 15 has recesses and projections to increase a modulus of elasticity.

The rotational angle sensor 60 (FIG. 1), which senses the rotational angle of the accelerator pedal 2, is installed to the side plate 16 and is thereby received in the support member 10. The rotational angle sensor 60 includes, for example, a Hall IC. The rotational angle sensor 60 is covered with a cover 30. The rotational angle sensor 60 senses a change in a magnetic field, which is created by a permanent magnet (not shown) installed to a shaft member of the accelerator pedal 2, to sense the rotational angle of the accelerator pedal 2. The side plate 16 includes a base projection (serving as a first interference portion) 21.

Figure 8:
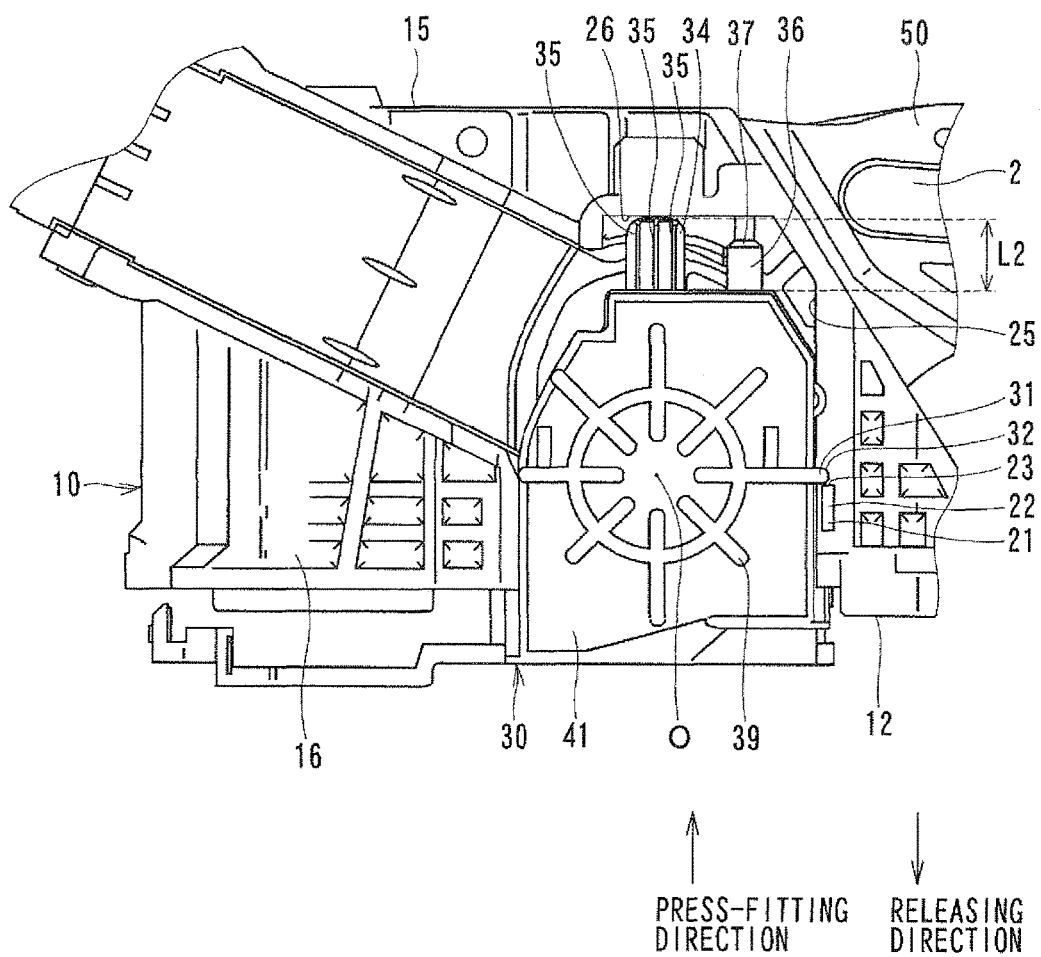
FIG. 8 is a partial lateral view indicating a state in a middle of an installation operation for installing a cover to a base according to the first embodiment.

The cover 30 is configured to have a U-shape in a cross-sectional view thereof. The cover 30 is installed to the support member 10 from the bottom plate 12 side (the lower side in FIG. 1) such that a first wall 41 and a second wall 42 of the cover 30, which are generally parallel to each other, hold the side plate 16 and the side plate 17 of the support member 10 therebetween. Upon installation of the cover 30 to the support member 10, the first wall 41 is placed adjacent to the side plate 16, and the second wall 42 is placed adjacent to the side plate 17. As shown in FIG. 8, a press-fitting portion 34 and an engaging portion 36 are formed at a distal end part, i.e., a leading end part (top end part in FIG. 8) of the first wall 41. The press-fitting portion 34 has three ribs 35. The press-fitting portion 34 is press-fitted into a press-fitting hole 26, which is formed in the side plate 16 (see FIG. 4). In this way, the cover 30 is fixed to the support member 10. The engaging portion 36 is inserted into an engaging hole (not shown), which is formed in the side plate 16. A claw (hook) 37 is formed at a distal end part of the engaging portion 36 to function as a removal limiting part of the engaging portion 36, which limits the removal through snap-fitting. Radially extending ribs 39 are formed in an outer surface of the first wall 41 to limit a change in an output of the rotational angle sensor 60 caused by a disturbing magnetic field. The cover 30 includes a cover projection (serving as a second interference portion) 31, which projects from a base projection 21 side surface of the cover 30. The cover projection 31 is formed integrally with the ribs 39.

Figure 5:
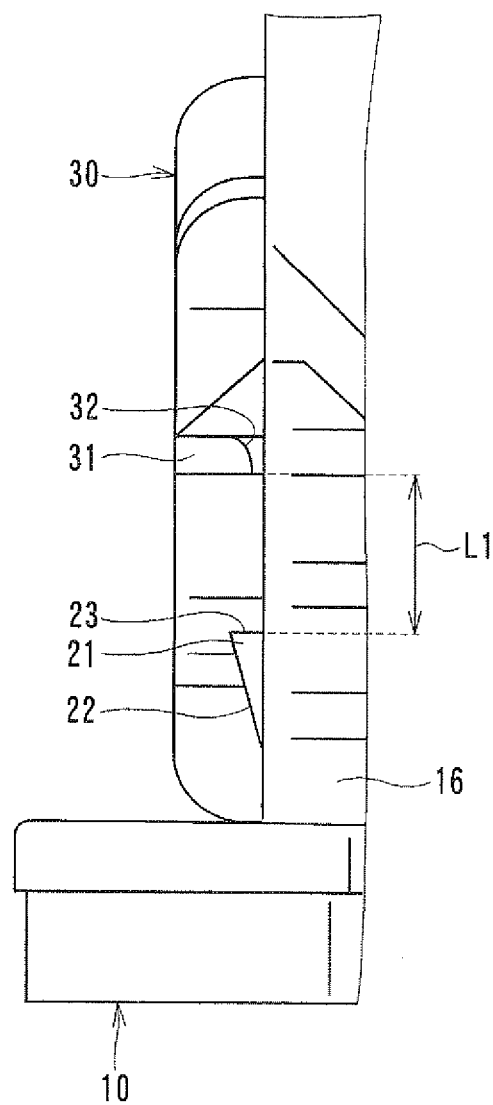
FIG. 5 is a partial enlarged view taken in a direction of an arrow V in FIG. 1.
Figure 6:
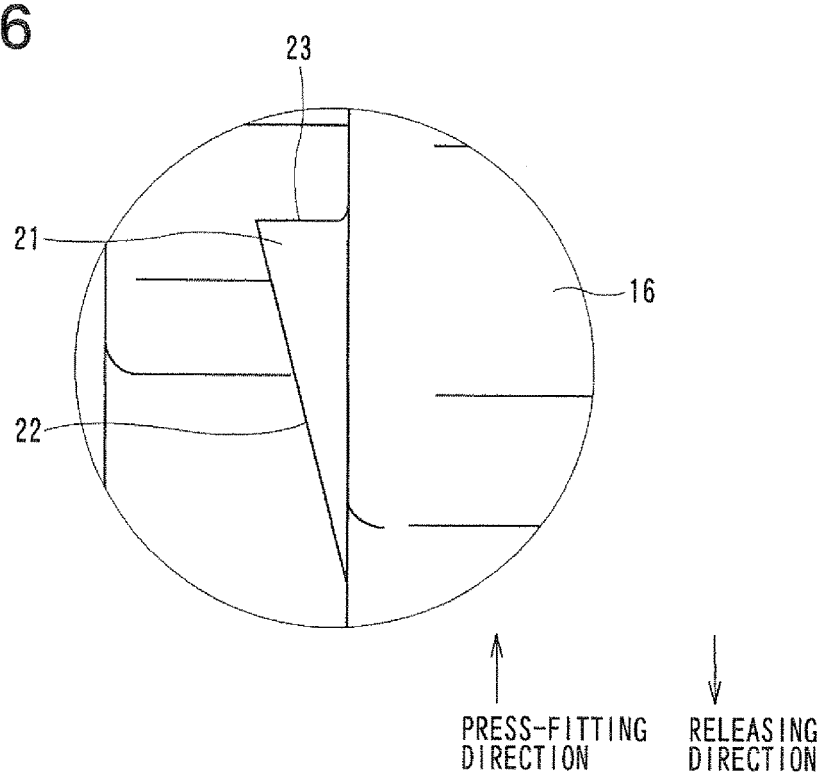
FIG. 6 is a partial enlarged view of a portion of the accelerator apparatus of FIG. 5.
Figure 7:
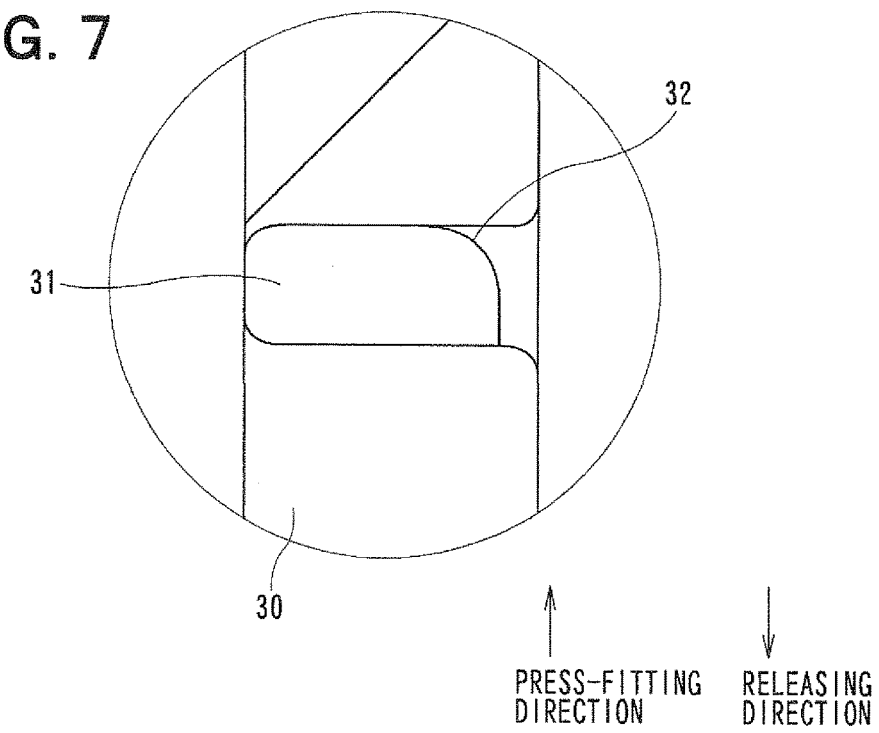
FIG. 7 is a partial enlarged view of another portion of the accelerator apparatus of FIG. 5.

Now, the base projection 21 and the cover projection 31 will be described with reference to FIGS. 5 to 7. FIG. 5 is a view taken in a direction of an arrow V in FIG. 1. FIG. 6 is an enlarged view showing a portion around the base projection 21 at FIG. 5. FIG. 7 is an enlarged view showing a portion around the cover projection 31 at FIG. 5. In FIG. 5, the accelerator pedal 2, the connecting member 50 and the like are omitted for the sake of simplicity.

The base projection 21 is formed to project on the surface of the side plate 16 at a side of a mount portion 25 (FIG. 8), to which the cover 30 is installed. The base projection 21 includes a slope portion 22, which is sloped and thereby has a small amount of projection (small projecting height serving as a first projecting height in the projecting direction of the base projection 21, i.e., the leftward direction in FIG. 5) at the bottom plate 12 side part of the slope portion 22 and has a large amount of projection (large projecting height serving as a second projecting height in the projecting direction of the base projection 21) at the top plate 15 side part of the slope portion 22. In other words, the amount of projection of the slope portion 22 increases from the bottom plate 12 side toward the top plate 15 side. A step 23 is formed at the top plate 15 side of the base projection 21. The step 23 is opposed to the cover projection 31 upon installation of the cover 30.

The cover projection 31 is formed to have an arcuately curved surface (an R-shaped surface) at a top plate 15 side end part 32 of the cover projection 31.

Now, with reference to FIG. 8, an installation operation for installing the cover 30 to the support member 10 will be described. The cover 30 is installed to the support member 10 by sliding the cover 30 from the bottom plate 12 side such that the side plates 16, 17 are held between the first wall 41 and the second wall 42 of the cover 30. The first wall 41 of the cover 30 is installed to the mount portion 25, which is formed in the surface of the side plate 16. In the middle of the installation operation of the cover 30, the cover projection 31 contacts the base projection 21. The base projection 21 includes the slope portion 22, which has the small amount of projection at the bottom plate 12 side and has the large amount of projection at the top plate 15 side. When the cover projection 31 smoothly slides over the slope portion 22, the first wall 41 can be easily resiliently deformed in the direction away from the side plate 16, i.e., toward the front side of the plane of FIG. 1. Furthermore, the top plate 15 side end part 32 of the cover projection 31, which is formed to have the arcuately curved surface (R-shaped surface), contacts the slope portion 22 of the base projection 21, so that the cover projection 31 smoothly moves over the base projection 21. In this way, it is possible to install the cover 30 without causing a damage to the base projection 21 and the cover projection 31.

FIG. 8 is a diagram showing a state immediately after movement of the cover projection 31 beyond the base projection 21, i.e., showing the state where the cover projection 31 is placed on the top side of the base projection 21 where the top plate 15 is located. As shown in FIG. 8, when the cover projection 31 has moved beyond the base projection 21, the press-fitting portion 34 is not yet press-fitted into the press-fitting hole 26. At this time, a distal end of the press-fitting portion 34 is placed at a location immediately before the press-fitting hole 26 (i.e., immediately below the press-fitting hole 26 in FIG. 8). Specifically, upon movement of the cover projection 31 from the bottom plate 12 side to the top plate 15 side beyond the base projection 21, when the cover 30 is further slid in the press-fitting direction, the press-fitting of the press-fitting portion 34 begins. The press-fitting portion 34 is press-fitted into the press-fitting hole 26 while the ribs 35 being collapsed, i.e., being urged radially inward by the wall of the press-fitting hole 26. Furthermore, the engaging portion 36 is inserted into the engaging hole (not shown), which is formed in the side plate 16. Upon completion of the press-fitting of the cover 30, the cover 30 is assembled to the support member 10 and is held in the state shown in FIGS. 1 to 3. In the press-fitted state of the press-fitting portion 34, a distance L1 (FIG. 1) between the cover projection 31 and the base projection 21 generally coincides with, i.e., is generally the same as a length L2 (FIG. 8) of the press-fitting portion 34 measured in the press-fitting direction.

Now, releasing of the cover 30 from the support member 10 will be described. The press-fitting portion 34, which is formed at the distal end part of the first wall 41, is press-fitted into the press-fitting hole 26. Therefore, at the time of releasing the cover 30, the cover 30 is moved toward the bottom plate 12 side while the first wall 41 of the cover 30 is urged against the side plate 16. At this time, the cover 30 cannot be moved toward the bottom plate 12 side while resiliently deforming the first wall 41 away from the side plate 16 without making a contact between the cover projection 31 and the base projection 21. When the press-fitting portion 34 is forcefully removed and is thereby released from the press-fitting hole 26, the cover projection 31 hits and thereby contacts the base projection 21 because of its momentum. Therefore, an impact mark (also referred to as an impact impression or impact stamp), which serves as a disassembly indication mark, is left on, i.e., is formed on at least one of the cover projection 31 and the base projection 21 upon the hitting of the cover projection 31 against the base projection 21. In this way, when the cover 30 is disassembled from the support member 10 after the assembling of the cover 30 to the support member 10, the mark, which indicates the fact of disassembling of the cover 30 from the support member 10, is left. In the present embodiment, the length L2 of the press-fitting portion 34 in the press-fitting direction generally coincides with the distance L1 between the cover projection 31 and the base projection 21 in the press-fitted state of the press-fitting portion 34. Therefore, the cover projection 31 hits and thereby contacts the base projection 21 at the time of removing the press-fitting portion 34 from the press-fitting hole 26. Thus, the disassembly indication mark can be reliably formed.

As discussed above, the base projection 21 is formed in the side plate 16 of the support member 10 in the accelerator apparatus 1 of the present embodiment. The cover 30 includes the press-fitting portion 34, which is press-fitted into the press fitting hole 26 of the side plate 16, and the cover projection 31. The cover projection 31 is formed at the location which is spaced from the base projection 21 in the state where the press-fitting portion 34 is press-fitted into the press-fitting hole 26. In the present embodiment, the base projection 21 and the cover projection 31 are constructed as follows. That is, when the cover 30 is slid in the releasing direction for releasing the press-fitting of the press-fitting portion 34 from the press-fitting hole 26, the cover projection 31 hits the base projection 21 to form the disassembly indication mark, which indicates the incident of the disassembling, on at least one of the cover projection 31 and the base projection 21. According to the present embodiment, the base projection 21 projects from the side plate 16 at the side of the mount portion 25, to which the cover 30 is installed. Furthermore, the cover projection 31 is formed to project at the side of the cover 30. In this way, in the case where the cover 30 is disassembled from the support member 10 by sliding the cover 30, the disassembly indication mark is formed on at least one of the base projection 21 and the cover projection 31. Thus, it is possible to implement the tamper-proof function. Also, at the time of assembling, the cover 30 can be easily assembled to the support member 10 by press-fitting the cover 30 to the support member 10. Therefore, it is possible to reduce the number of assembling steps.

The base projection 21 and the cover projection 31 are placed at the corresponding locations, respectively, so that the base projection 21 and the cover projection 31 contact with each other immediately after releasing of the press-fitting portion 34 from the press-fitting hole 26. In the present embodiment, the distance L1 between the base projection 21 and the cover projection 31 in the press-fitted state of the press-fitting portion 34 into the press-fitting hole 26 is generally the same as the length L2 of the press-fitting portion 34 measured in the press-fitting direction. In this way, in the case where the cover 30 is disassembled from the base 20 by sliding the cover 30, the cover projection 31 hits and thereby contacts the base projection 21 immediately after releasing of the press-fitting portion 34 from the press-fitting hole 26. Thereby, the tamper-proof function can be reliably implemented.

Also, the base projection 21 is formed as follows. That is, in the press-fitted state of the press-fitting portion 34 where the press-fitting portion 34 is press-fitted into the press-fitting hole 26, the amount of projection of the slope portion 22 of the base projection 21 at the bottom plate 12 side (i.e., the side opposite from the cover projection 31) is small, and the amount of projection of the slope portion 22 of the base projection 21 at the top plate 15 side (i.e., the side where the cover projection 31 is located) is large. In other words, the amount of projection of the slope portion 22 of the base projection 21 increases from the bottom plate 12 side toward the top plate 15 side. In this way, the first wall 41 of the cover 30 can be easily deformed in the direction away from the support member 10 when the cover projection 31 is slid over the slope portion 22 at the time of installing the cover 30 to the support member 10. Thereby, the installability of the cover 30 to the support member 10 is improved.

Furthermore, the cover projection 31 is formed to have the arcuately curved surface (R-shaped surface) at the top plate 15 side end part 32 of the cover projection 31. At the time of assembling the cover 30 to the support member 10 by sliding the cover 30, the cover projection 31 can smoothly contact the base projection 21 due to the arcuately curved surface of the top plate 15 side end part 32 of the cover projection 31, which contacts the base projection 21. Therefore, the installability of the cover 30 to the support member 10 can be improved.

In the present embodiment, the tamper-proof structure described above is used in the accelerator apparatus 1. The accelerator apparatus 1 includes the support member 10, the accelerator pedal 2 and the rotational angle sensor 60. The support member 10 is installable to the vehicle body. The accelerator pedal 2 is rotatably supported by the support member 10. The accelerator pedal 2 is operated by the driver of the vehicle by pressing the same. The rotational angle sensor 60 senses the rotation of the accelerator pedal 2. The cover 30 covers the rotational angle sensor 60, which is received in the support member 10. In this way, when the cover 30, which covers the rotational angle sensor 60, is disassembled, the disassembly indication mark can be reliably left.

In the present embodiment, the support member 10 serves as the base of the present invention, and the support member 10 and the cover 30 serve the tamper proof molded article of the present invention.

In the above-described embodiment, the first interference portion is made by the base projection 21, and the second interference portion is made by the cover projection 31. The first interference portion and the second interference portion may be modified as follows. In second to third embodiments shown in FIGS. 9 to 12, the base and the cover are schematically illustrated. FIG. 10 is a cross-sectional view taken along line X-X in FIG. 9. FIG. 12 is a cross-sectional view taken along line XII-XII in FIG. 11. In each of the second and third embodiments discussed below, a base 120, 220, i.e., a support member is substantially the same as that of the first embodiment except the points discussed below.

Second Embodiment

Figure 9:
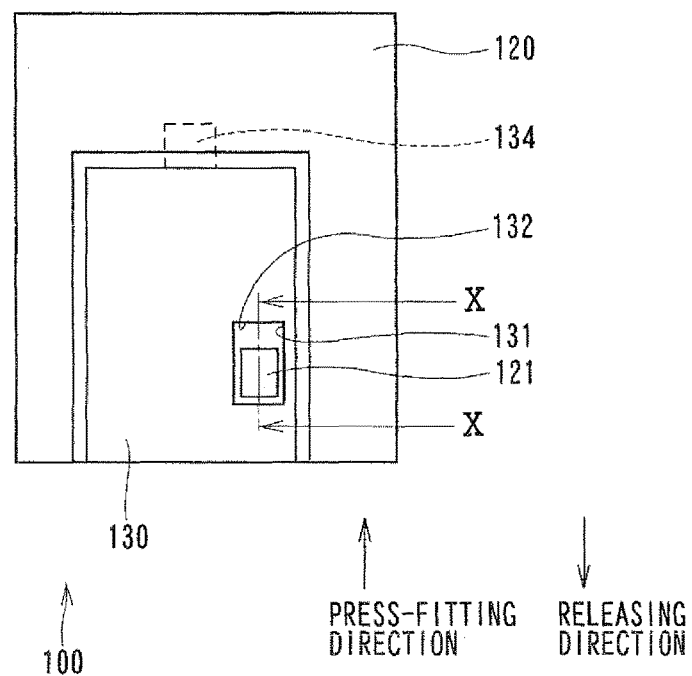
FIG. 9 is a schematic view showing a base projection and a cover hole according to a second embodiment of the present invention.
Figure 10:
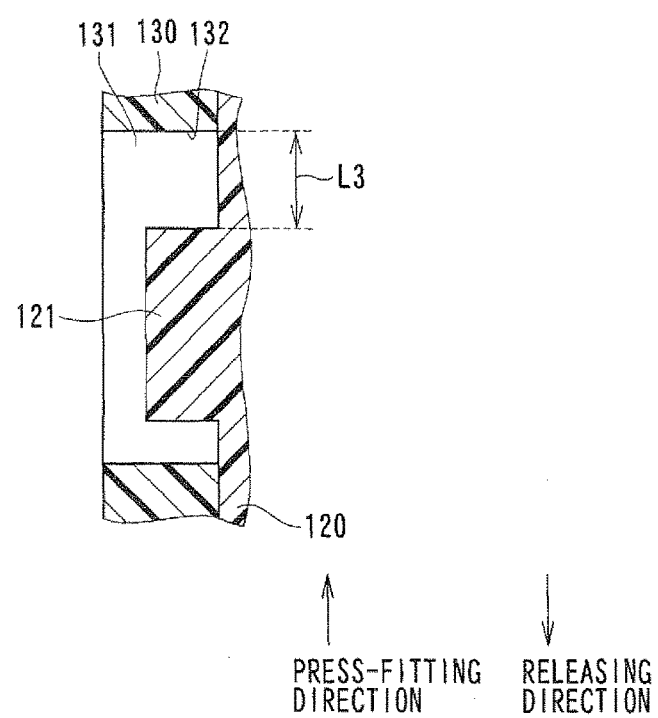
FIG. 10 is a partial cross-sectional view taken along line X-X in FIG. 9.

In a second embodiment, a tamper-proof molded article 100 shown in FIGS. 9 and 10 includes a base (support member) 120 and a cover 130. The base 120 includes a base projection (serving as a first interference portion) 121.

The cover 130 is installed to the base 120 by sliding the cover 130 over the base 120 from the bottom plate 12 side. The cover 130 has a press-fitting portion 134 and a cover hole (serving as a second interference portion) 131. The press-fitting portion 134 is placed at a distal end part of the cover 130 (i.e., a leading end part of the cover 130 in the press-fitting direction of the cover 130). The press-fitting portion 134 is securely press-fitted to the base 120 (more specifically, a press-fitting hole of the base 120, which is similar to the press-fitting hole 26 of the first embodiment). The cover hole 131 is formed in a surface of the cover 130, which contacts the base 120, at a location that corresponds to the base projection 121. A step part 132 is formed at a press-fitting portion 134 side end part (a top plate 15 side end part) of the cover hole 131. In the state where the press-fitting portion 134 is press-fitted into the base 120, the base projection 121 is received in the cover hole 131. In the press-fitted state of the press-fitting portion 134, in which the press-fitting portion 134 is press-fitted into the base 120, the step part 132 of the cover hole 131 is spaced from the base projection 121.

In the present embodiment, the cover hole 131 is formed as the through hole, which penetrates through the wall of the cover 130 from the base 120 side to the side opposite from the base 120 in the direction perpendicular to the plane of the first wall of the cover 130 (i.e., in the direction perpendicular to the pane of FIG. 9). However, as long as the base projection 121 can be received in the cover hole 131, the cover hole 131 may be formed as a blind hole, which is recessed from the base 120 side to the side opposite from the base 120 without penetrating through the wall of the cover 130 from the base 120 side to the side opposite from the base 120.

At the time of releasing the cover 130 from the base 120, the cover 130 is slid in the releasing direction for releasing the press-fitting portion 134 from the press-fitting hole of the base 120 while the cover 130 is urged against the base 120. When the press-fitting portion 134 is released from the press-fitting hole of the base 120, the step part 132 of the cover hole 131 hits and thereby contacts the base projection 121. Thus, an impact mark (also referred to as an impact impression or impact stamp), which serves as the disassembly indication mark, is left on at least one of the base projection 121 and the step part 132 upon the hitting of the step part 132 of the cover hole 131 against the base projection 121. In this way, when the cover 130 is disassembled from the base 120 after the assembling of the cover 30 to the base 120, the mark (disassembly indication mark), which indicates the fact of disassembling of the cover 30 from the base 120, is left.

In the present embodiment, the cover hole 131, which is formed in the surface of the cover 130, which contacts the base 120, serves as the second interference portion. Furthermore, the base projection 121, which is received in the cover hole 131 in the state where the press-fitting portion 134 is press-fitted into the press-fitting hole of the base 120, serves as the first interference portion. In this way, when the cover 130 is disassembled from the base 120, the step part 132 of the cover hole 131 hits the base projection 121 to form the disassembly indication mark in at least one of the base projection 121 and the step part 132. Thereby, the tamper-proof function can be reliably implemented.

Furthermore, the base projection 121 and the step part 132 of the cover hole 131 are placed at the corresponding locations, respectively, so that the step part 132 of the cover hole 131 can hit the base projection 121 at the time immediately after the releasing of the press-fitting portion 134 from the press-fitting hole of the base 120. Specifically, in the state where the press-fitting portion 134 is press-fitted into the press-fitting hole of the base 120, a distance L3 between the base projection 121 and the step part 132 of the cover hole 131 generally coincides with, i.e., is generally the same as the length of the press-fitting portion 134 measured in the press-fitting direction. In this way, in the case where the cover 130 is disassembled from the base 120 by sliding the cover 130, the step part 132 hits and thereby contacts the base projection 121 immediately after the releasing of the press-fitting portion 134 from the press-fitting hole of the base 120. Thereby, the tamper-proof function can be reliably implemented.

Furthermore, the end part of the base projection 121 and the end part of the cover hole 131 may be configured to have an arcuately curved surface (R-shape). In addition, a peripheral edge part of the cover 130, which surrounds the opening of the cover hole 131, may be sloped. Also, the base projection 121 may be sloped. In this way, the installability of the cover 130 to the base 120 at the time of sliding the cover 130 over the base 120 can be improved.

Third Embodiment

Figure 11:
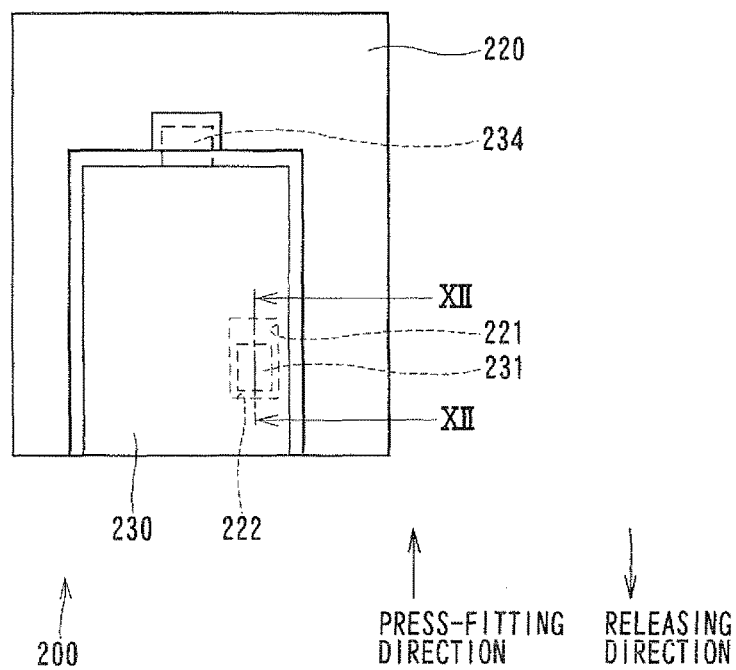
FIG. 11 is a schematic view showing a base hole and a cover projection according to a third embodiment of the present invention.
Figure 12:
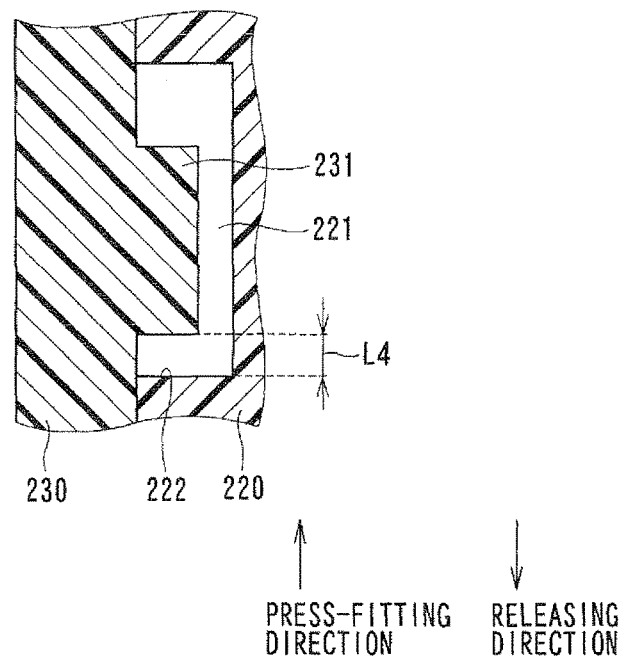
FIG. 12 is a schematic cross-sectional view taken along line XII-XII in FIG. 11.

In a third embodiment, a tamper-proof molded article 200, which is shown in FIGS. 11 and 12, includes a base 220 and a cover 230. The base 220 includes a base hole (serving as a first interference portion) 221. The base hole 221 is formed in the surface of the base 220, which contacts the cover 230, at a location, which corresponds to a cover projection 231 of the cover 230 described later. A step part 222 is formed in an end part (a bottom plate 12 side end part) of the base hole 221, which is opposite from the press-fitting portion 234 in the releasing direction of the cover 230.

The cover 230 is installed to the base 220 by sliding the cover 230 over the base 220 from the bottom plate 12 side (the bottom side in FIG. 11). The cover 230 has the press-fitting portion 234 and the cover projection (serving as a second interference portion) 231. The press-fitting portion 234 is placed at a distal end part of the cover 230 (i.e., a leading end part of the cover 230 in the press-fitting direction of the cover 230). The press-fitting portion 234 is securely press-fitted to the base 220 (more specifically, a press-fitting hole of the base 220, which is similar to the press-fitting hole 26 of the first embodiment). The cover projection 231 is formed in the surface of the cover 230, which contacts the base 220. In the state where the press-fitting portion 234 is press-fitted into the base 220, the cover projection 231 is received in the base hole 221. In the press-fitted state of the press-fitting portion 234, in which the press-fitting portion 234 is press-fitted into the press-fitting hole of the base 220, the step part 222 of the base hole 221 is spaced from the cover projection 231.

At the time of releasing the cover 230 from the base 220, the cover 230 is slid in the releasing direction for releasing the press-fitting portion 234 from the press-fitting hole of the base 220 while the cover 230 is urged against the base 220. When the press-fitting portion 234 of the cover 230 is forcefully removed and is thereby released from the press-fitting hole of the base 220, the cover projection 231 hits and thereby contacts the step part 222 of the base hole 221 because of its momentum. Thereby, an impact mark (also referred to as an impact impression or impact stamp), which serves as the disassembly indication mark, is left on at least one of the step part 222 and the cover projection 231. In this way, when the cover 230 is disassembled from the base 220 after the assembling of the cover 230 to the base 220, the mark, which indicates the fact of disassembling of the cover 230 from the base 220, is left.

In the present embodiment, the base hole 221, which is formed in the surface of the base 220, which contacts the cover 230, serves as the first interference portion. Furthermore, the base projection 231, which is received in the base hole 221 in the state where the press-fitting portion 234 is press-fitted into the press-fitting hole of the base 220, serves as the second interference portion. In this way, when the cover 230 is disassembled from the base 220, the cover projection 231 hits the step part 222 of the base hole 221 to form the disassembly indication mark in at least one of the cover projection 231 and the step part 222 of the base hole 221. Thereby, the tamper-proof function can be reliably implemented.

Furthermore, the step part 222 of the base hole 221 and the cover projection 231 are placed at the corresponding locations, respectively, so that the cover projection 231 can hit the step part 222 of the base hole 221 at the time immediately after the releasing of the press-fitting portion 234 from the press-fitting hole of the base 220. According to the present embodiment, in the press-fitted state of the press-fitting portion 234 into the press-fitting hole of the base 220, a distance L4 between the step part 222 of the base hole 221 and the cover projection 231 is generally the same as a length of the press-fitting portion 234 in the press-fitting direction thereof. In this way, in the case where the cover 230 is disassembled from the base 220 by sliding the cover 230, the cover projection 231 hits and thereby contacts the step part 222 immediately after the releasing of the press-fitting portion 234 from the press-fitting hole of the base 220. Thereby, the tamper-proof function can be reliably implemented.

Furthermore, the end part of the base hole 221 and the end part of the cover projection 231 may be configured to have an arcuately curved surface (R-shape). Also, the peripheral edge part of the base hole 221, which surrounds the opening of the base hole 221, may be sloped. In addition, the cover projection 231 may be sloped. In this way, the installability of the cover 230 to the base 220 at the time of sliding the cover 230 over the base 220 can be improved.

In the present embodiment, the base hole 221 and the cover projection 231, which form the tamper-proof structure, are not visible from the outside. Therefore, it is possible to limit disassembling of the cover 230 from the base 220 by an unfaithful user who is intentionally trying to remove the cover 230 without leaving any mark or indication, which shows the disassembling of the cover 230.

Now, modifications of the above embodiments will be described.

In the above embodiments, the distance between the first interference portion and the second interference portion in the press-fitted state of the press-fitting portion is generally the same as the length of the press-fitting portion in the press-fitting direction thereof. In a modification of any of the above embodiments, the distance between the first interference portion and the second interference portion in the press-fitted state of the press-fitting portion into the press-fitting hole may be made larger than the length of the press-fitting portion in the press-fitting direction as long as the first interference portion and the second interference portion can contact with each other upon the releasing of the press-fitting portion from the press-fitting hole. That is, it is possible to set a relationship of La>Lb where La denotes the distance between the first interference portion and the second interference portion in the press-fitted state of the press-fitting portion, and Lb denotes the length of the press-fitting portion in the press-fitting direction thereof.

In the above embodiments, the cover and the base are made of the resin. In a modification of any one of the above embodiments, any other suitable material, which is other than the resin, may be used for at least one of the cover and the base as long as the disassembly indication mark can be left thereon upon the interference (contact) between the first interference portion and the second interference portion.

In the above embodiments, the tamper-proof molded article is used for the accelerator apparatus. Particularly, in the first embodiment, the tamper-proof molded article is made from the support member and the cover, which covers the rotational angle sensor. In a modification of any one of the above embodiments, the tamper-proof molded article may be made by any other member(s) of the accelerator apparatus. The tamper-proof molded article of the present invention may be also equally applicable to any other device or apparatus, which is other than the accelerator apparatus.

The present invention is not limited the above embodiments and modifications thereof. That is, the above embodiments and modifications thereof may be modified in various ways without departing from the spirit and scope of the invention.

What is claimed is:

1. A tamper-proof molded article comprising:
  a base that includes a first interference portion, which is formed as one piece with a plate of the base; and
  a cover that is installed to the base and includes:
    a press-fitting portion that is press-fitted into a corresponding portion of the base in a press-fitting direction to place the press-fitting portion into a press-fitted state; and
    a second interference portion that is placed at a location, which is spaced from the first interference portion in the press-fitted state of the press-fitting portion, wherein the second interference portion is formed as one piece with a wall of the cover, which is placed adjacent to the wall of the base, and the first interference portion and the second interference portion are configured such that the first interference portion and the second interference portion contact with each other to form a disassembly indication mark, which indicates disassembling between the cover and the base, on at least one of the first interference portion and the second interference portion when the cover is slid over the base in a releasing direction, which is opposite from the press-fitting direction, to release the press-fitting portion from the corresponding portion of the base and thereby to disassemble between the cover and the base, and the second interference portion is formed as one piece with a wall of the cover to limit detachment of the second interference portion from the wall of the cover when the first interference portion and the second interference portion contact with each other to form the disassembly indication mark on the at least one of the first interference portion and the second interference portion.

2. The tamper-proof molded article according to claim 1, wherein the first interference portion and the second interference portion are placed at corresponding locations, respectively, at which the first interference portion and the second interference portion are adapted to contact with each other immediately after releasing of the press-fitting of the press-fitting portion from the corresponding portion of the base.

3. The tamper-proof molded article according to claim 1, wherein a distance between the first interference portion and the second interference portion in the press-fitted state of the press-fitting portion is substantially the same as a length of the press-fitting portion, which is measured in the press-fitting direction.

4. The tamper-proof molded article according to claim 1, wherein:
the base includes a mount portion, to which the cover is installed;
the first interference portion is a first projection that projects from a surface of the base, at which the mount portion is formed, on a lateral side of the mount portion; and
the second interference portion is a second projection, which projects from a lateral surface of the cover.

5. The tamper-proof molded article according to claim 4, wherein:
the first projection includes a slope portion;
the slope portion is sloped such that one side part of the slope portion, which is opposite from the second projection in the press-fitting direction in the press-fitted state of the press-fitting portion, has a first projecting height in a projecting direction of the first projection, and another side part of the slope portion, which is located on a second projection side and is opposite from the one side part of the slope portion in the press-fitting direction, has a second projecting height in the projecting direction of the first projection; and
the second projecting height is larger than the first projecting height in the projecting direction of the first projection.

6. The tamper-proof molded article according to claim 4, wherein the second projection has an end part, which is opposite from the first projection in the press-fitting direction in the press-fitted state of the press-fitting portion, and the end part of the second projection has an arcuately curved surface.

7. The tamper-proof molded article according to claim 1, wherein:
the second interference portion is a cover hole that is formed in a surface of the cover, which contacts the base; and
the first interference portion is a first projection, which is received in the cover hole in the press-fitted state of the press-fitting portion.

8. The tamper-proof molded article according to claim 1, wherein:
the first interference portion is a base hole that is formed in a surface of the base, which contacts the cover; and
the second interference portion is a second projection, which is received in the base hole in the press-fitted state of the press-fitting portion.

9. The tamper-proof molded article according to claim 1, wherein the press-fitting portion is configured such that the press-fitted state of the press-fitting portion is maintained at least until the second interference portion of the cover is placed adjacent to the first interference portion of the base during a time of sliding the cover over the base in the releasing direction.

10. The tamper-proof molded article according to claim 1, wherein the first interference portion is formed as one piece with the base.

11. An accelerator apparatus comprising a tamper-proof molded article, the tamper-proof molded article comprising:
a base that includes a first interference portion, which is formed as one piece with a plate of the base; and
a cover that is installed to the base and includes:
a press-fitting portion that is press-fitted into a corresponding portion of the base in a press-fitting direction to place the press-fitting portion into a press-fitted state; and
a second interference portion that is placed at a location, which is spaced from the first interference portion in the press-fitted state of the press-fitting portion, wherein the second interference portion is formed as one piece with a wall of the cover, which is placed adjacent to the wall of the base, and the first interference portion and the second interference portion are configured such that the first interference portion and the second interference portion contact with each other to form a disassembly indication mark, which indicates disassembling between the cover and the base, on at least one of the first interference portion and the second interference portion when the cover is slid over the base in a releasing direction, which is opposite from the press-fitting direction, to release the press-fitting portion from the corresponding portion of the base and thereby to disassemble between the cover and the base, and the second interference portion is formed as one piece with a wall of the cover to limit detachment of the second interference portion from the wall of the cover when the first interference portion and the second interference portion contact with each other to form the disassembly indication mark on the at least one of the first interference portion and the second interference portion.

12. The accelerator apparatus according to claim 11, wherein the base is a support member, which is adapted to be installed to a body of a vehicle.

13. The accelerator apparatus according to claim 12, further comprising:
an accelerator pedal that is rotatably supported by the support member and is adapted to be operated by a driver of the vehicle; and
a rotation sensing member that is received in the support member and senses rotation of the accelerator pedal, wherein the cover covers the rotation sensing member, which is received in the support member.

* * * * *